United States Patent
Ying et al.

(10) Patent No.: US 7,944,313 B1
(45) Date of Patent: *May 17, 2011

(54) CALIBRATING CONTROL LOOPS

(75) Inventors: Edward Ying, Berkeley, CA (US);
Pantas Sutardja, Los Gatos, CA (US);
David Rutherford, San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 12/783,454

(22) Filed: May 19, 2010

Related U.S. Application Data (63) Continuation of application No. 12/239,568, filed on Sep. 26, 2008, now Pat. No. 7,737,793.

(60) Provisional application No. 60/975,595, filed on Sep. 27, 2007.

(51) Int. Cl.
*G11B 5/09* (2006.01)
*H03L 7/085* (2006.01)

(52) U.S. Cl. ............... 331/17; 331/1 A; 331/25; 360/51

(58) Field of Classification Search .............. 331/1 A, 331/16–18, 25; 360/51
See application file for complete search history.

(56) References Cited

U.S. PATENT DOCUMENTS

| | | | |
|---|---|---|---|
| 4,616,276 A | 10/1986 | Workman | |
| 4,673,982 A | 6/1987 | Tam et al. | |
| 5,914,829 A | 6/1999 | Kadlec et al. | |
| 6,011,899 A | 1/2000 | Ohishi et al. | |
| 6,133,783 A | 10/2000 | Stockman et al. | |
| 6,141,175 A | 10/2000 | Nazarian et al. | |
| 6,441,692 B1 | 8/2002 | Nakatani et al. | |
| 0,056,136 A1 | 3/2003 | Aweya et al. | |
| 6,664,827 B2 | 12/2003 | O'Leary et al. | |
| 6,738,205 B1 | 5/2004 | Moran et al. | |
| 6,775,091 B1 | 8/2004 | Sutardja | |
| 0,008,643 A1 | 1/2007 | Brady et al. | |
| 7,191,355 B1 | 3/2007 | Ouellette et al. | |
| 7,206,159 B2 | 4/2007 | White | |
| 7,209,312 B1 | 4/2007 | Sutardja | |
| 7,333,280 B1 | 2/2008 | Lifchits et al. | |
| 7,372,875 B2 | 5/2008 | Hadzic et al. | |
| 7,378,810 B1 | 5/2008 | Sutardja et al. | |
| 7,424,080 B1 | 9/2008 | Liu | |
| 7,737,793 B1* | 6/2010 | Ying et al. ............ 331/17 |
| 2004/0090890 A1 | 5/2004 | Abramovich et al. | |

OTHER PUBLICATIONS

Chew, Kok Kia et al., "Digital Control for Repetitive Errors in Disk Drive Systems," 1990, IEEE Control Systems Magazine, 5 pages.
Marvell, "88i6310 Integrated Hard Disk Drive Electronics," Mar. 1, 2005, published by Marvell International Ltd., Application Notes, Doc. No. MV-S300613-00 Rev. A, 186 pages.
Mercedes, Dismery E., Examiner, U.S. Appl. No. 11/325,277, in Office Action mailed Sep. 23, 2008, to be published by the USPTO, 10 pages.

(Continued)

*Primary Examiner* — David Mis (57) ABSTRACT

Systems and techniques to calibrate a control loop include, in at least one implementation, a system including the control loop configured to generate a clock signal and lock the clock signal to timing marks detected on a machine readable medium, a repetitive error correction module configured to receive a predicted phase and a corrected phase error for the clock signal, generate a predicted repetitive phase disturbance using the predicted phase and the corrected phase error for the clock signal, and calibrate a phase error to compensate for variations in repetitive phase errors in the clock signal using the predicted repetitive phase disturbance; and a servo track generator configured to generate servo tracks using the clock signal.

20 Claims, 8 Drawing Sheets

OTHER PUBLICATIONS

Mercedes, Dismery E., Examiner, U.S. Appl. No. 11/325,277, in Office Action mailed Apr. 14, 2009, to be published by the USPTO, 9 pages.

Ying, Edward, "Repetitive Feed-Forward Algorithm For Self-Servo-Write PLL", U.S. Appl. No. 11/325,277, filed Jan. 4, 2006, to be published by the USPTO, 48 pages.

* cited by examiner

CALIBRATING CONTROL LOOPS

CROSS-REFERENCE TO RELATED APPLICATIONS

This application is a continuation application of and claims the benefit of priority to U.S. patent application Ser. No. 12/239,568, filed Sep. 26, 2008, which claims priority to U.S. Provisional Application Ser. No. 60/975,595, filed on Sep. 27, 2007, which are incorporated by reference herein in their entirety.

TECHNICAL FIELD

The subject matter of this specification relates to signal processing.

BACKGROUND

Conventional hard disk drives (HDD) increasingly use self-servo-write (SSW) processes to write servo sectors using the same heads that are used to read/write data. A read/write channel can be synchronized to rotational timing marks (RTM). The rotational timing marks can be, for example, back-electro-motive force (BEMF) sensor pulses in a spindle motor or reference servo sectors that are already written on a media (e.g., concentric servo sectors or spirals on a magnetic media). The SSW sectors can be written using a clock (e.g., a SSW clock) from the read/write channel hardware and can be used to measure the timing of consecutive rotational timing marks. For example, timing information can be presented as a series of timestamps on a free-running counter (e.g., a modulo counter) clocked by a SSW clock. The SSW clock is synchronized to the rotational timing marks in order to properly write the SSW sectors. For example, a voltage controlled oscillator (VCO) can adjust the frequency and phase of the SSW clock.

A control loop can be used to synchronize the SSW clock to the rotational timing marks. Examples of control loops include, but are not limited to, frequency-locked loops (FLL) and phase-locked loops (PLL). Typically, a PLL is used for synchronization in a SSW process. Due to variations in spindle speed, spindle motor assembly tolerances and/or written-in RTM errors, the RTMs can include variations that are synchronous and non-synchronous relative to spindle rotation. Furthermore, the variations can produce repeatable and non-repeatable phase errors. The repeatable and non-repeatable phase errors can result in non-uniform placement of SSW sectors. Phase errors can be minimized by increasing the bandwidth of the PLL. Increasing the PLL bandwidth can, however, increase system noise and reduce system stability and performance.

SUMMARY

Methods, systems, and apparatus, including computer program products, are described for calibrating control loops, specifically phase-locked loops.

In one aspect, an apparatus is provided that includes an oscillator model that generates a predicted phase based on an input, a first averaging submodule that generates an average predicted phase over a predetermined number of samples, and a first summing submodule that receives a first corrected phase error and generates a predicted repetitive phase disturbance using the first corrected phase error, the predicted phase, and the average predicted phase. Other embodiments of this aspect include corresponding systems, methods, and computer program products.

One or more implementations can optionally include one or more of the following features. The apparatus can further include a high-pass filter that processes the input. The predetermined number of samples can be over a revolution. The input can be based on a phase-locked loop command. The oscillator model can be a voltage controlled oscillator model. The apparatus can further include an amplifier that scales the predicted repetitive phase disturbance, and a delay buffer that generates a repetitive phase error correction using the predicted repetitive phase disturbance. The repetitive phase error correction can be used to generate a second corrected phase error.

The apparatus can further include a second averaging submodule that generates an average repetitive phase error correction over the predetermined number of samples, and a second summing submodule that generates a refined repetitive phase error correction using the repetitive phase error correction and the average repetitive phase error correction. The refined repetitive phase error correction can be used to calibrate a raw phase error and generate the second corrected phase error. The apparatus can further include a low-pass filter that processes the average repetitive phase error correction.

The delay buffer can store N repetitive phase error corrections, where an ith repetitive phase error correction $CB_i$ can be expressed as: $CB_i(k)=U_{REC}(k)+K_{REC} \cdot RPD_P(k)$. $K_{REC}$ is a gain of the amplifier, $K_{REC} \ll 1$, m is a revolution number, k is a phase-locked loop sample number, N is a number of rotational timing mark samples per revolution, and i=k modulo N. $U_{REC}(k)=CB_i(k-N)-\overline{CB_f^m}$, where $\overline{CB_f^m}$ is the average repetitive phase error correction. The delay buffer can be a circular buffer.

The oscillator model $G_{VCO}(z)$ can be expressed as:

$$G_{VCO}(z) = \frac{-ExpectedTMI/C}{1-z^{-1}}.$$

ExpectedTMI is an expected interval between timing marks, C is a scaling factor, and z is a discrete time variable. C can equal $2^{21}$. The predicted repetitive phase disturbance $RPD_P$ can be expressed as: $RPD_P=CPE-(\Phi_P-\overline{\Phi_P})$. CPE is the first corrected phase error, $\Phi_P$ is the predicted phase, and $\overline{\Phi_P}$ is the average predicted phase.

In another aspect, a method is provided that includes receiving a corrected phase error, generating a predicted repetitive phase disturbance using the corrected phase error, and iteratively calibrating a raw phase error to compensate for variations in repetitive phase errors using the predicted repetitive phase disturbance. Other embodiments of this aspect include corresponding systems, apparatus, and computer program products.

In another aspect, a method is provided that includes generating a predicted phase based on an input, generating an average predicted phase over a predetermined number of samples to reduce a bias component of the predicted phase, receiving a first corrected phase error, and generating a predicted repetitive phase disturbance using the first corrected phase error, the predicted phase, and the average predicted phase. Other embodiments of this aspect include corresponding systems, apparatus, and computer program products.

One or more implementations can optionally include one or more of the following features. The method can further include processing the input to reduce a bias component of the input. The predetermined number of samples can be over a revolution. The input can be based on a phase-locked loop command. The method can further include scaling the predicted repetitive phase disturbance, and generating a repetitive phase error correction using the predicted repetitive phase disturbance. The repetitive phase error correction can be used to generate a second corrected phase error.

The method can further include generating an average repetitive phase error correction over the predetermined number of samples, and generating a refined repetitive phase error correction using the repetitive phase error correction and the average repetitive phase error correction. The refined repetitive phase error correction can be used to calibrate a raw phase error and generate the second corrected phase error. The method can further include processing the average repetitive phase error correction to reduce discontinuities. The method can further include generating the second corrected phase error including subtracting the refined repetitive phase error correction from the raw phase error.

An ith repetitive phase error correction $CB_i$ can be expressed as: $CB_i(k)=U_{REC}(k)+K_{REC} \cdot RPD_P(k)$. $K_{REC}$ is a gain of the amplifier, $K_{REC} \ll 1$, m is a revolution number, k is a phase-locked loop sample number, N is a number of rotational timing mark samples per revolution, and i=k modulo N. $U_{REC}(k)=CB_i(k-N)-\overline{CB_f^m}$, where $\overline{CB_f^m}$ is the average repetitive phase error correction.

Generating the predicted phase can include using a model $G_{VCO}(z)$ expressed as:

$$G_{VCO}(z) = \frac{-ExpectedTMI/C}{1 - z^{-1}}.$$

ExpectedTMI is an expected interval between timing marks, C is a scaling factor, and z is a discrete time variable. C can equal $2^{21}$. The predicted repetitive phase disturbance $RPD_P$ can expressed as: $RPD_P = CPE-(\Phi_P - \overline{\Phi_P})$. CPE is the first corrected phase error, $\Phi_P$ is the predicted phase, and $\overline{\Phi_P}$ is the average predicted phase.

In another aspect, a system is provided that includes a phase-locked loop (PLL) responsive to an input. The PLL can determine a raw phase error between measured timing information and target timing information. The system also includes a repetitive error correction module responsive to the input and a corrected phase error and produces a repetitive phase error correction. The corrected phase error is a difference between the raw phase error and a previous repetitive phase error correction. Other embodiments of this aspect include corresponding methods, apparatus, and computer program products.

Particular embodiments of the subject matter described in this specification can be implemented to realize none, one or more of the following advantages. Calibrating phased-locked loops can: (i) reduce phase errors; (ii) increase the accuracy of servo sector placement; and (iii) increase the precision of phase-locked loops. These advantages can increase the precision and accuracy of SSW processes.

The details of one or more embodiments of the invention are set forth in the accompanying drawings and the description below. Other features and advantages of the invention will be apparent from the description and drawings, and from the claims.

DETAILED DESCRIPTION

Figure 1:
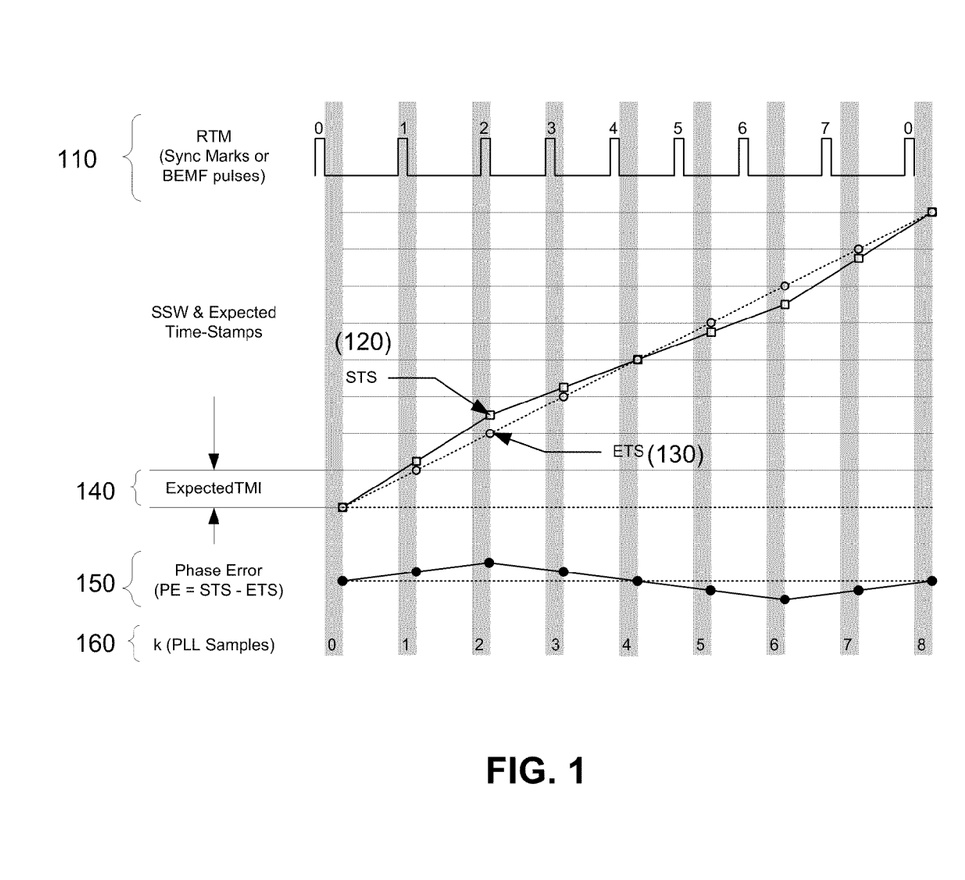
FIG. 1 is a diagram that includes example timing and phase information.

FIG. 1 is a diagram 100 that includes example timing and phase information. The diagram 100 includes rotational timing marks 110 (e.g., BEMF pulses), self-servo-write timestamps (STS) 120, expected timestamps (ETS) 130, expected timing mark intervals (TMI) 140, phase errors (PE) 150, and indices for phase-locked loop samples 160. The diagram 100 includes timing and phase information for a spindle motor that generates eight rotational timing marks 110 per revolution. Other configurations are possible.

The rotational timing marks 110 can be detected and the self-servo-write timestamps 120 are used to indicate a time at which each rotational timing mark 110 occurred. Errors in the phases of the rotational timing marks 110 can cause the rotational timing marks 110 to occur and be detected at intervals (e.g., timing mark intervals) different from the expected timing mark intervals 140. For example, BEMF pulses 0 and 4 can represent rotational timing marks 110 with no phase error (e.g. timing marks at ideal positions of a sample). As other examples, BEMF pulses 1, 2, and 3 can represent rotational timing marks 110 with positive phase errors (e.g., rotational timing marks shifted to the right in time). As other examples, BEMF pulses 4, 5, 6, and 7 can represent rotational timing marks 110 with negative phase errors (e.g., rotational timing marks shifted to the left in time).

For each sample, a phase error 150 can be calculated by subtracting an expected timestamp 130 from a corresponding self-servo-write timestamp 120. The calculation of the expected timestamp 130 can be expressed by the equation:

$$ETS(k) = ETS(k-1) + ExpectedYMI = \sum_{n=1}^{k} (n \cdot ExpectedTMI)$$

where $k > 0$;

where ETS(k) is the expected timestamp 130 for a phase-locked loop sample, k is an index for the phase-locked loop sample 160, and ExpectedTMI is an expected timing mark interval 140. In some implementations, phase error 150 can be calculated from an integral of error between a timing mark interval and an expected timing mark interval 140.

In some implementations, a PLL uses the timing and phase information to synchronize a self-servo-write clock to the rotational timing marks 110. In the PLL, self-servo-write timestamps 120 can be locked to expected timestamps 130. In some implementations, the self-servo-write timestamps 120 can be generated by a modulo counter in the self-servo-write clock. Locking the self-servo-write timestamps 120 to expected timestamps 130 can also lock the PLL to a target frequency.

In some implementations, a FLL uses the timing and phase information to synchronize a self-servo-write clock to the rotational timing marks 110. In the FLL, timing mark intervals can be locked to the expected timing mark intervals 140. The expected timing mark intervals 140 can be inversely proportional to a target frequency. Other implementations are possible.

Errors determined from the timing and phase information can be used to calibrate the control loops.

Figure 2:
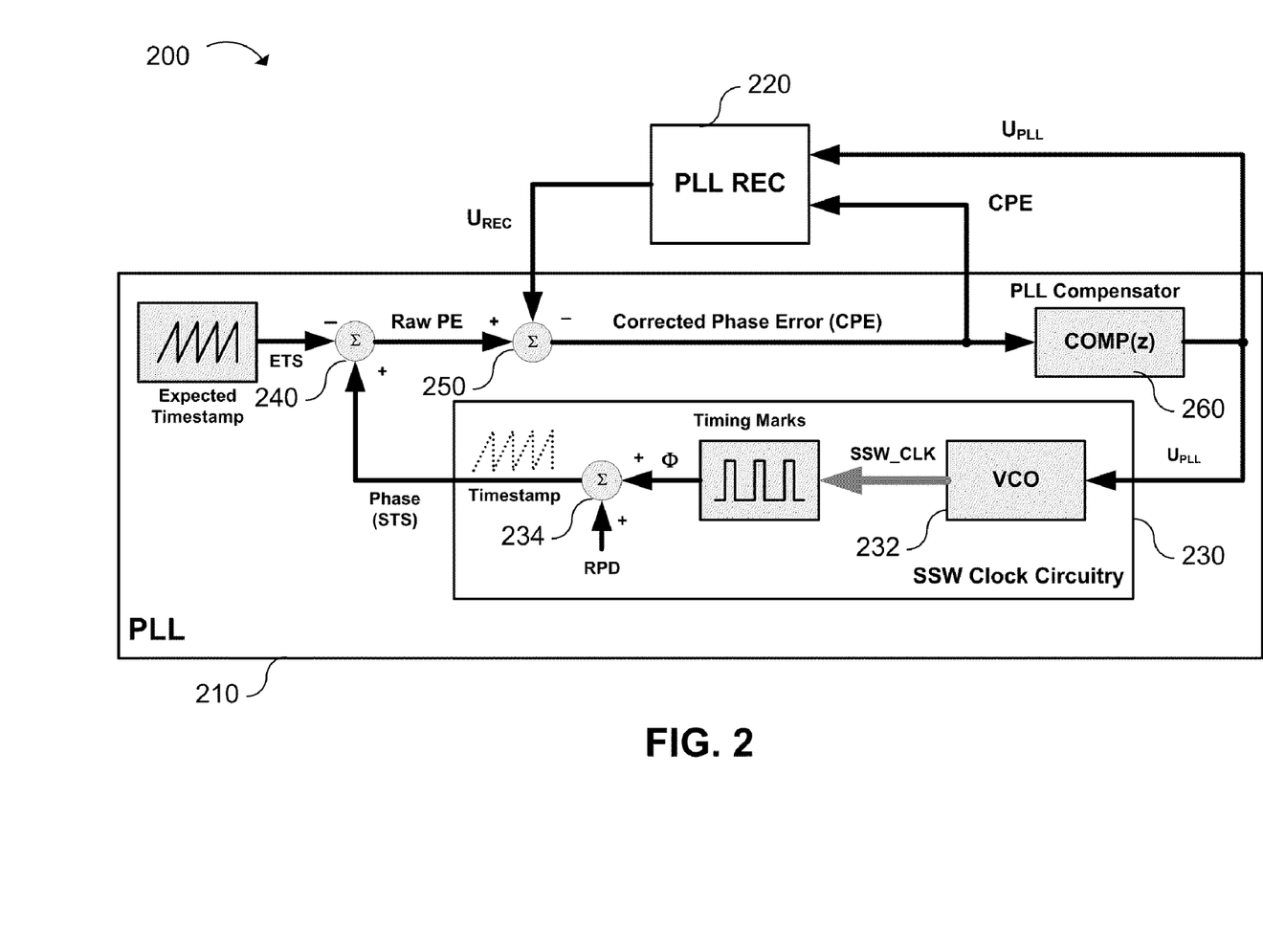
FIG. 2 is a conceptual block diagram that includes an example phase-locked loop and an example repetitive error correction module.

FIG. 2 is a conceptual block diagram 200 that includes an example phase-locked loop 210 and an example repetitive error correction (REC) module 220 (e.g., a PLL REC module). The PLL 210 includes self-servo-write clock circuitry 230, comparators (240 and 250), and a PLL compensator 260. The SSW clock circuitry 230 receives a PLL control command ($U_{PLL}$). A voltage controlled oscillator (VCO) 232 can receive the PLL control command and adjust the SSW clock (e.g., a SSW_CLK signal) according to the PLL control command. The VCO can be used to adjust the SSW clock so that the self-servo-write timestamps match the expected timestamps. For example, a timing mark interval between rotational timing marks can equal an expected timing mark interval. The expected timing mark interval can be determined by a spindle speed and a number of rotational timing marks per revolution. The difference between the measured self-servo-write timestamps and the expected timestamps is the phase error.

The SSW clock circuitry 230 can determine the phase ($\Phi$) of the timing marks (e.g., rotational timing marks) from the SSW clock. The timestamps can have phases that include repetitive phase errors (e.g., errors caused by repetitive phase disturbances), as represented by a summing module 234 adding the repetitive phase errors to the phase. The repetitive phase errors can be caused by, for example, variations in spindle speed, spindle motor assembly tolerances, and written-in rotational timing mark errors. The rotational timing marks can exhibit variations that are synchronous and non-synchronous relative to the spindle rotation. The synchronous and non-synchronous variations can produce repeatable and non-repeatable phase errors. The SSW clock circuitry 230 can output the self-servo-write timestamps.

The PLL 210 can compare the self-servo-write timestamps to expected timestamps to determine a phase error. For example, the comparator 240 can subtract an expected timestamp from the SSW timestamp to generate a raw phase error. The repetitive error correction module 220 can generate a repetitive phase error correction command ($U_{REC}$). The repetitive phase error correction command can be used to calibrate the raw phase error. For example, the repetitive phase errors can be reduced by subtracting the repetitive phase error correction command from the raw phase error to produce a corrected phase error (CPE). The corrected phase error can be calculated by the PLL 210 using the equation CPE(k)=RawPE(k)−$U_{REC}$(k). The repetitive error correction module 220 generates the repetitive phase error correction command from the corrected phase error and a PLL control command.

The PLL compensator 260 can use errors (e.g., the corrected phase error) to correct the error between the self-servo-write timestamps and the expected timestamps by calculating and outputting a corrective action (e.g., a compensated signal) to adjust the SSW clock. The phase-locked loop command can be generated by the PLL 210 by applying a compensation algorithm to the corrected phase error, and can be expressed as $U_{PLL}(k)$=COMP(z)·CPE(k). For example, the PLL compensator 260 can use a proportional-integral (PI) compensation algorithm to generate the PLL control command from the corrected phase error.

Figure 3:
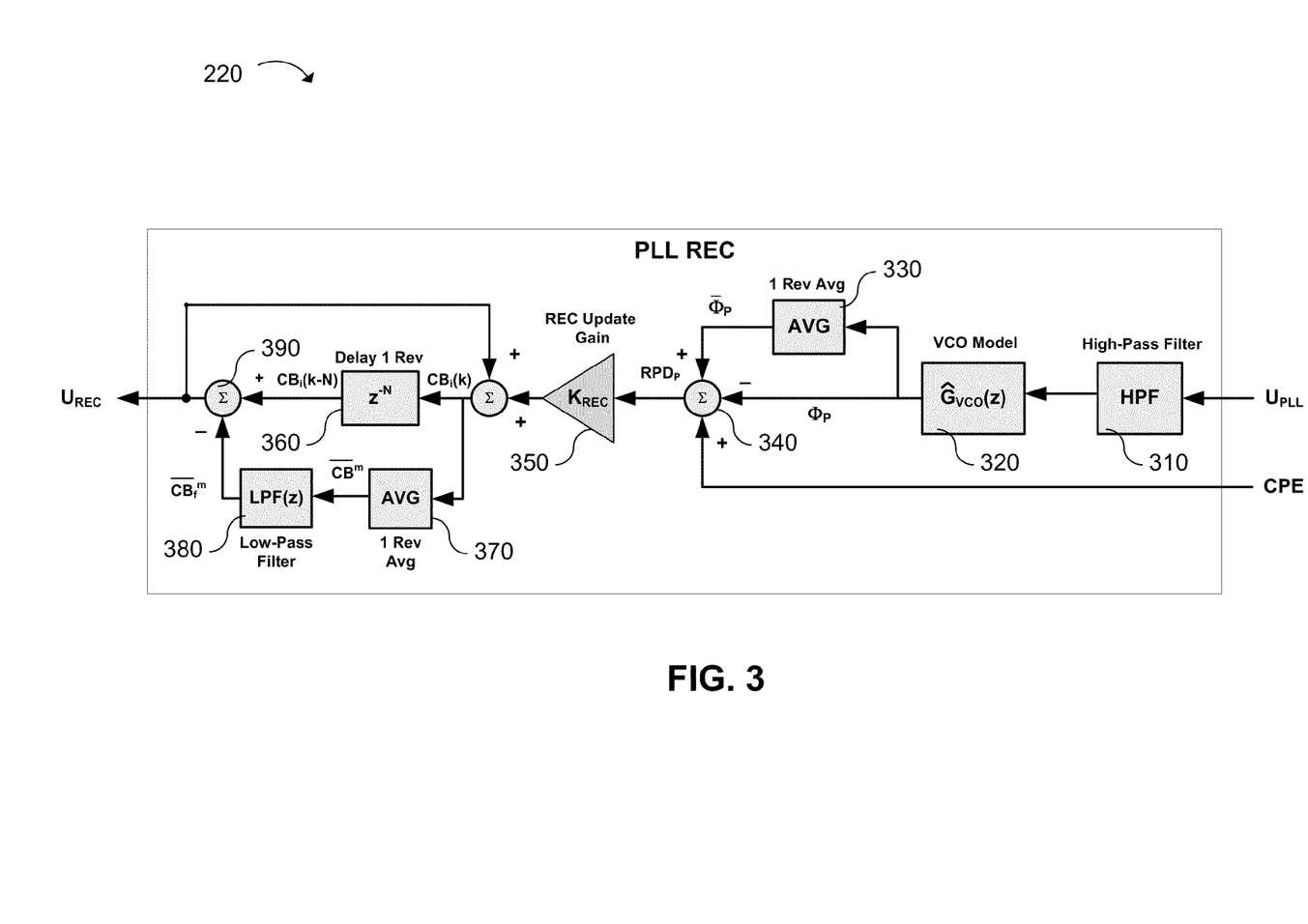
FIG. 3 is a conceptual block diagram of the example repetitive error correction module of FIG. 2.

FIG. 3 is a conceptual block diagram of the example repetitive error correction module 220 of FIG. 2. The repetitive error correction module 220 includes a high-pass filter 310, an oscillator model (e.g., a VCO model) 320, a first averaging submodule 330, a first summing submodule 340, an amplifier 350, a delay buffer 360, a second averaging submodule 370, a low-pass filter 380, and a second summing submodule 390.

The high-pass filter 310 can receive an input (e.g., the PLL control command). The high-pass filter 310 can process the input to produce an output. For example, the high-pass filter 310 can remove a bias component (e.g., a DC component) of the PLL control command to produce the output. The oscillator model 320 can transform the output into a predicted phase. For example, a known or characterized VCO model can transform the filtered PLL control command (e.g., a frequency control) to predict an uncorrupted and unbiased predicted phase ($\Phi_P$). The predicted phase is uncorrupted because it does not include the effect of the repetitive phase disturbance, and unbiased because the high-pass filter 310 can remove the DC component. The VCO model can be represented as a discrete-time integrator. For example, the VCO model $G_{VCO}(z)$ can be expressed as:

$$G_{VCO}(z) = \frac{-ExpectedTMI/C}{1-z^{-1}};$$

where ExpectedTMI is an expected timing mark interval, C is a scaling factor, and z is a discrete time variable. The ExpectedTMI can be the expected interval between timing marks in terms of clock counts. Furthermore, in some implementations, C can equal $2^{21}$.

For example, the oscillator model 320 can transform the output into a predicted phase expressed as:

$$\Phi_P(k) = \Phi_P(k-1) - HPF(U_{PLL}) \cdot \frac{ExpectedTMI}{2^{21}},$$

where HPF represents a function of a high-pass filter. In some implementations, other transformation models can be used as the oscillator model.

The predicted phase can include a residual bias component (e.g., a residual DC bias component). In some implementations, the first averaging submodule 330 can estimate the residual bias component. The first averaging submodule 330 can average the predicted phases from PLL samples over a single revolution, for example, to generate an average predicted phase ($\overline{\Phi_P}$).

A repetitive phase error at each rotational timing mark can be predicted. The first summing submodule 340 can receive a corrected phase error and generate a predicted repetitive phase disturbance ($RPD_P$) using the corrected phase error, the predicted phase, and the average predicted phase. The first summing submodule 340 can sum the average predicted phase and the corrected phase error, and subtract the predicted phase to generate the predicted repetitive phase disturbance. The predicted repetitive phase disturbance can be expressed as:

$$RPD_P = CPE - (\Phi_P - \overline{\Phi_P})$$

In some implementations, a fraction of $RPD_P$ is added to a one revolution delay buffer 360. The delay buffer 360 can be used with the second summing submodule 390 to generate a repetitive phase error correction (e.g., feed-forward command $U_{REC}$). The amplifier 350 can attenuate the predicted repetitive phase disturbance by a fractional gain (e.g., an REC update gain $K_{REC}$).

For example, a circular delay buffer CB can include N values of repetitive phase error correction values $CB_i$. The N values of repetitive phase error corrections can be incrementally stored in the delay buffer CB that is expressed as:

$$CB_i(k) = U_{REC}(k) + K_{REC} \cdot RPD_P(k);$$

where $K_{REC}$ is a gain of the amplifier, $K_{REC} \ll 1$; m is a revolution number; k is a phase-locked loop sample number; N is a number of rotational timing mark samples per revolution; i=k modulo N (e.g., a timing mark sample index); and $U_{REC}(k) = CB_i(k-N) - \overline{CB_f^m}$, where $\overline{CB_f^m}$ is the filtered average repetitive phase error correction for the mth revolution. Because $K_{REC} \ll 1$, the delay buffer CB can process a signal like a low-pass filter, reducing sensitivity to VCO modeling errors and noise.

$U_{REC}(k)$ is the feed-forward command read from the ith entry in the delay buffer CB, which was updated in a previous revolution, subtracted by a filtered average repetitive phase error correction (e.g., a current DC component of the delay buffer CB). In some implementations, $\overline{CB^m}$ can be calculated by averaging CB over N samples. An average repetitive phase error correction is determined for each revolution m. For example, the average repetitive phase error correction for revolution m can be expressed as:

$$\overline{CB^m} = \frac{1}{N} \cdot \sum_{i=0}^{N-1} CB_i.$$

When a different value for the average repetitive phase error correction is applied, the different value may cause a discontinuity in $U_{REC}$. In some implementations, a low-pass filter (LPF(z)) can be applied to $\overline{CB^m}$ to smooth out the discontinuity from the one revolution average and produce $\overline{CB_f^m}$. For example, $\overline{CB_f^m} = \lambda \cdot \overline{CB_f^m}(k-1) + (1-\lambda) \cdot \overline{CB^m}$, where $\lambda$ represents the discrete-time pole of the low-pass filter.

Figure 4:
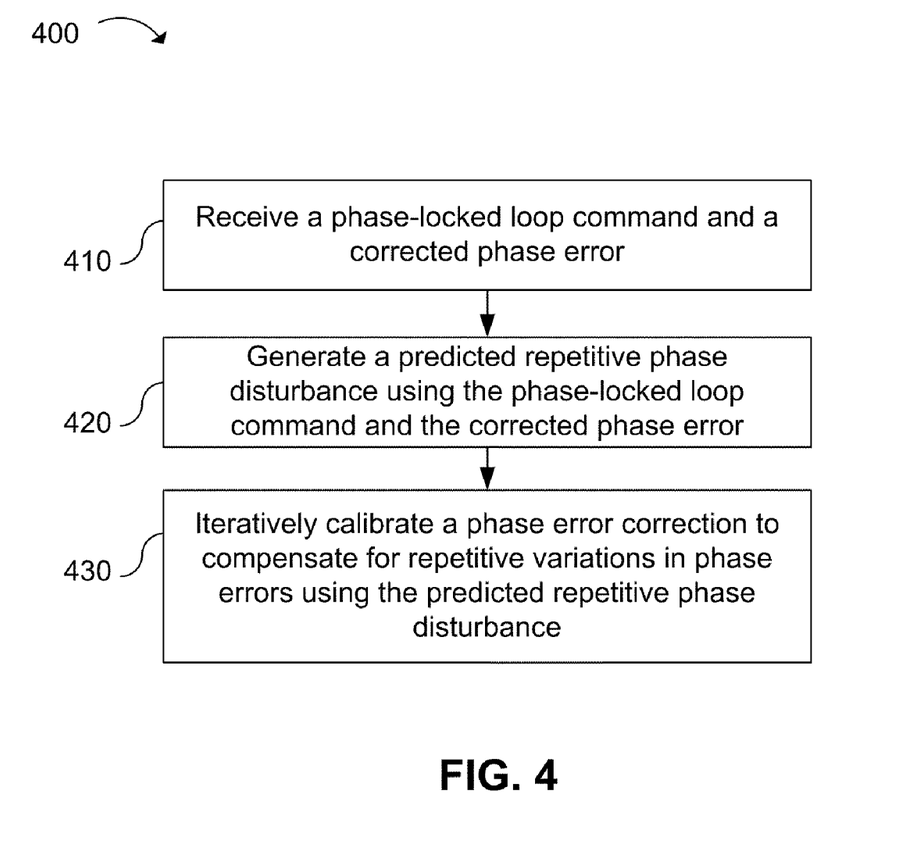
FIG. 4 is a flowchart showing an example process for repetitive error correction in phase-locked loops.

FIG. 4 is a flowchart showing an example process 400 for repetitive error correction in phase-locked loops. The process 400 includes receiving 410 a phase-locked loop command and a corrected phase error. For example, the REC module 220 can receive the phase-locked loop command and the corrected phase error from the PLL 210. A predicted repetitive phase disturbance is generated 420 using the phase-locked loop command and the corrected phase error. For example, the REC module 220 can generate a predicted repetitive phase disturbance using the phase-locked loop command and the corrected phase error. A phase error correction, to compensate for repetitive variations in phase errors using the predicted repetitive phase disturbance, is iteratively calibrated 430. For example, the REC module 220 can iteratively calibrate the phase error correction for repetitive variations in phase errors using the predicted repetitive phase disturbance for each PLL sample k.

In some implementations, the process can be performed continuously to adapt to time-varying changes in repetitive phase errors. Other implementations are possible.

In addition, correcting repetitive phase errors can be used in a plurality of SSW PLL applications. For example, the correction can be used in PLLs applied to spindle motor BEMF rotational timing marks used in self-servo-write of spirals or concentric reference servo sectors (RSS), PLLs applied to spiral reference servo sectors when writing concentric SSW sectors, and PLLs applied to concentric reference servo sectors when duplicating SSW sectors. Furthermore, correcting repetitive phase errors is not limited to phase-locked loops used in hard disk drive self-servo-write processes. Implementations of similar systems and techniques can be used in any applications that use phase-locked loops, or other types of control loops (e.g., frequency-locked loops).

Figure 5A:
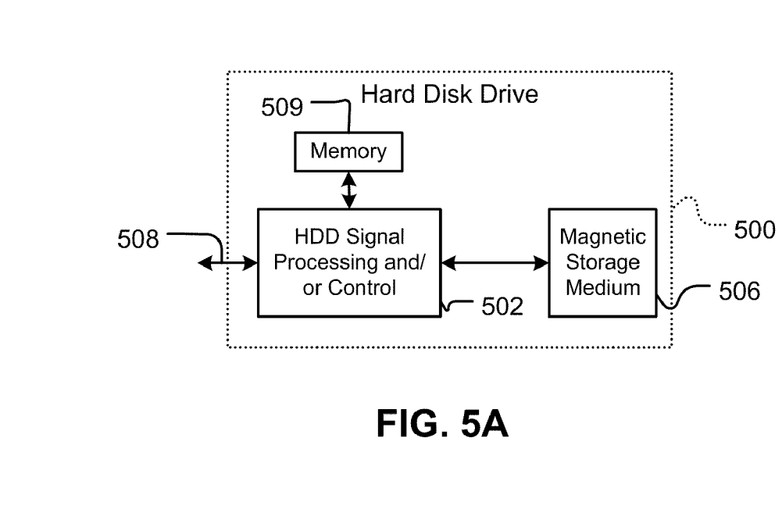
FIGS. 5A-5G show various example implementations of the described systems and techniques.

FIGS. 5A-5G show various example implementations of the described systems and techniques. Referring now to FIG. 5A, the described systems and techniques can be implemented in a hard disk drive (HDD) 500. The described systems and techniques may be implemented in either or both signal processing and/or control circuits, which are generally identified in FIG. 5A at 502. In some implementations, the signal processing and/or control circuit 502 and/or other circuits (not shown) in the HDD 500 may process data, perform coding and/or encryption, perform calculations, and/or format data that is output to and/or received from a magnetic storage medium 506.

The HDD 500 may communicate with a host device (not shown) such as a computer, mobile computing devices such as personal digital assistants, cellular phones, media or MP3 players and the like, and/or other devices via one or more wired or wireless communication links 508. The HDD 500 may be connected to memory 509 such as random access memory (RAM), low latency nonvolatile memory such as flash memory, read only memory (ROM) and/or other suitable electronic data storage.

Figure 5B:
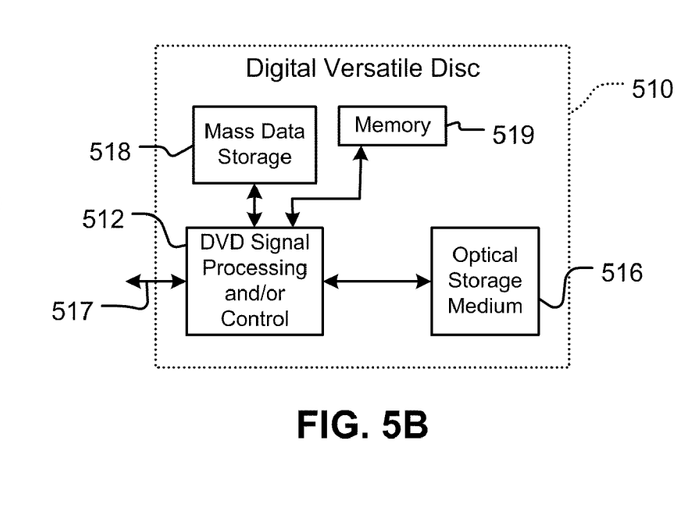

Referring now to FIG. 5B, the described systems and techniques can be implemented in a digital versatile disc (DVD) drive 510. The described systems and techniques may be implemented in either or both signal processing and/or control circuits, which are generally identified in FIG. 5B at 512, and/or mass data storage of the DVD drive 510. The signal processing and/or control circuit 512 and/or other circuits (not shown) in the DVD drive 510 may process data, perform coding and/or encryption, perform calculations, and/or format data that is read from and/or data written to an optical storage medium 516. In some implementations, the signal processing and/or control circuit 512 and/or other circuits (not shown) in the DVD drive 510 can also perform other functions such as encoding and/or decoding and/or any other signal processing functions associated with a DVD drive.

The DVD drive 510 may communicate with an output device (not shown) such as a computer, television or other device via one or more wired or wireless communication links 517. The DVD drive 510 may communicate with mass data storage 518 that stores data in a nonvolatile manner. The mass data storage 518 may include a hard disk drive (HDD). The HDD may have the configuration shown in FIG. 5A. The HDD may be a mini HDD that includes one or more platters having a diameter that is smaller than approximately 1.8". The DVD drive 510 may be connected to memory 519 such as RAM, ROM, low latency nonvolatile memory such as flash memory and/or other suitable electronic data storage.

Figure 5C:
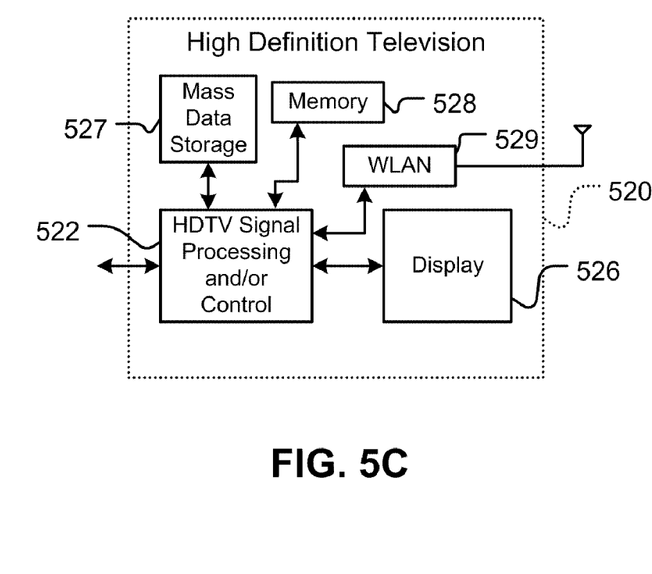

Referring now to FIG. 5C, the described systems and techniques can be implemented in a high definition television (HDTV) 520. The described systems and techniques may be implemented in either or both signal processing and/or control circuits, which are generally identified in FIG. 5C at 522, a WLAN interface and/or mass data storage of the HDTV 520. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as optical and/or magnetic storage devices. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". The HDTV 520 may be connected to memory 528 such as RAM, ROM, low latency nonvolatile memory such as flash memory and/or other suitable electronic data storage. The HDTV 520 also may support connections with a WLAN via a WLAN interface 529.

Figure 5D:
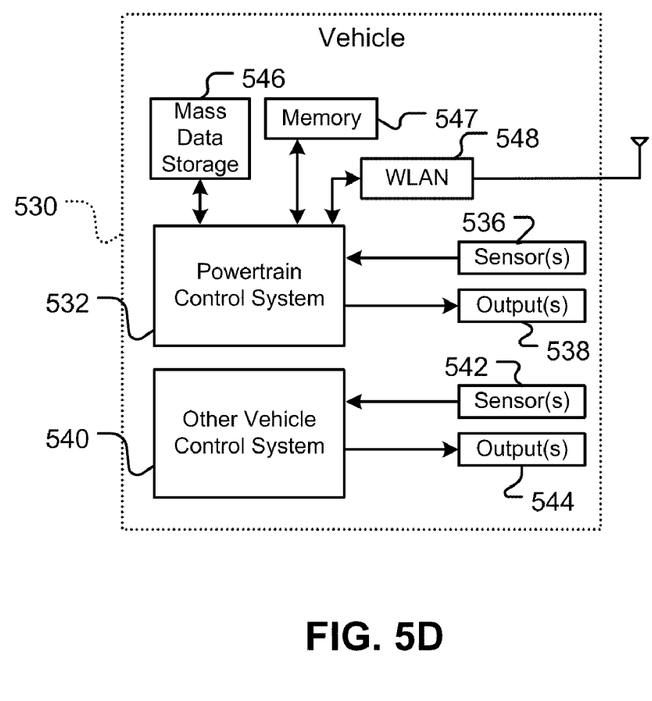

Referring now to FIG. 5D, the described systems and techniques may be implemented in a control system of a vehicle 530, a WLAN interface and/or mass data storage of the vehicle control system. In some implementations, the described systems and techniques may be implemented in a powertrain control system 532 that receives inputs from one or more sensors 536 such as temperature sensors, pressure sensors, rotational sensors, airflow sensors and/or any other suitable sensors and/or that generates one or more output control signals such as engine operating parameters, transmission operating parameters, braking parameters, and/or other control signals to one or more output devices 538.

The described systems and techniques may also be implemented in other control systems 540 of the vehicle 530. The control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices for example hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". The powertrain control system 532 may be connected to memory 547 such as RAM, ROM, low latency nonvolatile memory such as flash memory and/or other suitable electronic data storage. The powertrain control system 532 also may support connections with a WLAN via a WLAN interface 548. The control system 540 may also include mass data storage, memory and/or a WLAN interface (all not shown).

Figure 5E:
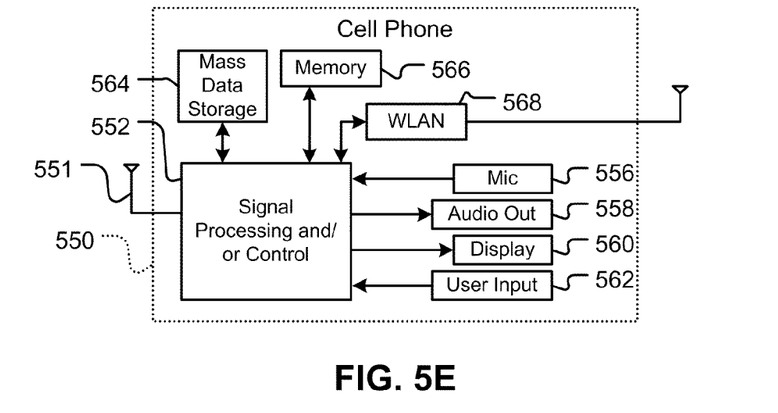

Referring now to FIG. 5E, the described systems and techniques can be implemented in a cellular phone 550 that may include a cellular antenna 551. The described systems and techniques may be implemented in either or both signal processing and/or control circuits, which are generally identified in FIG. 5E at 552, a WLAN interface and/or mass data storage of the cellular phone 550. In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices for example hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". The cellular phone 550 may be connected to memory 566 such as RAM, ROM, low latency nonvolatile memory such as flash memory and/or other suitable electronic data storage. The cellular phone 550 also may support connections with a WLAN via a WLAN interface 568.

Figure 5F:
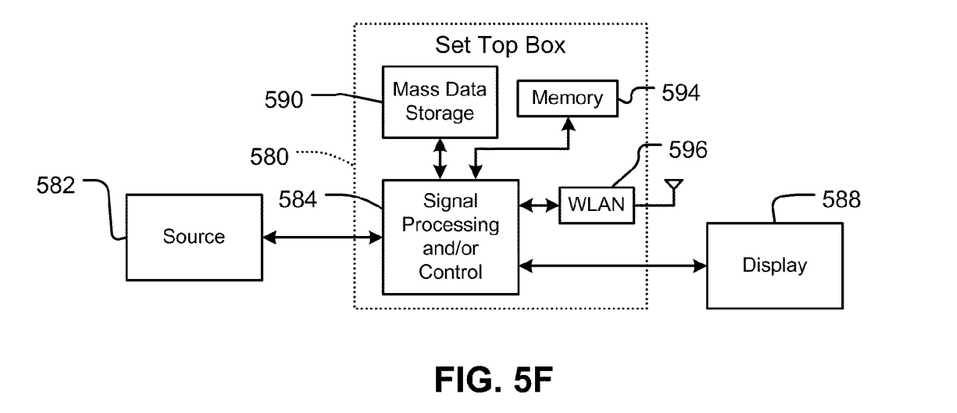

Referring now to FIG. 5F, the described systems and techniques can be implemented in a set top box 580. The described systems and techniques may be implemented in either or both signal processing and/or control circuits, which are generally identified in FIG. 5F at 584, a WLAN interface and/or mass data storage of the set top box 580. The set top box 580 receives signals from a source 582 such as a broadband source and outputs standard and/or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices for example hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". The set top box 580 may be connected to memory 594 such as RAM, ROM, low latency nonvolatile memory such as flash memory and/or other suitable electronic data storage. The set top box 580 also may support connections with a WLAN via a WLAN interface 596.

Figure 5G:
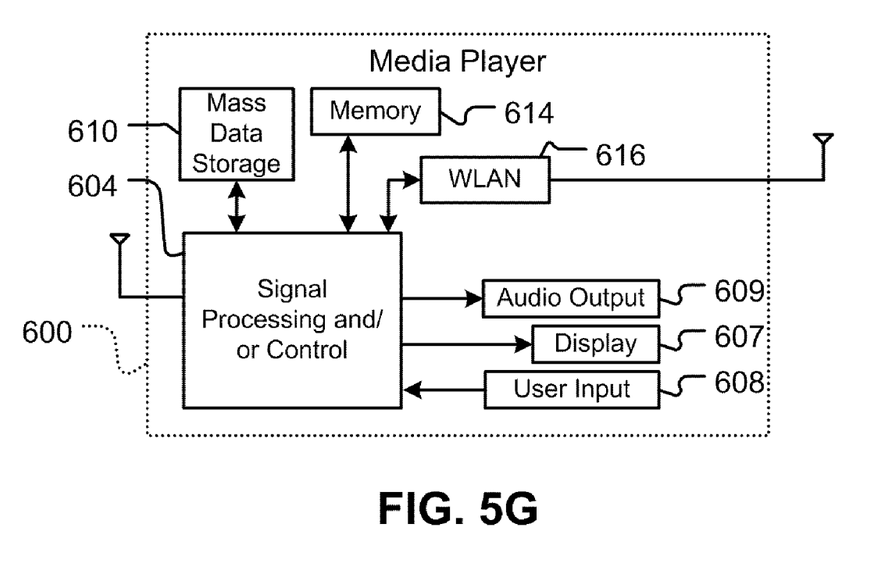

Referring now to FIG. 5G, the described systems and techniques can be implemented in a media player 600. The described systems and techniques may be implemented in either or both signal processing and/or control circuits, which are generally identified in FIG. 5G at 604, a WLAN interface and/or mass data storage of the media player 600. In some implementations, the media player 600 includes a display 607 and/or a user input 608 such as a keypad, touchpad and the like. In some implementations, the media player 600 may employ a graphical user interface (GUI) that typically employs menus, drop down menus, icons and/or a point-and-click interface via the display 607 and/or user input 608. The media player 600 further includes an audio output 609 such as a speaker and/or audio output jack. The signal processing and/or control circuits 604 and/or other circuits (not shown) of the media player 600 may process data, perform coding and/or encryption, perform calculations, format data and/or perform any other media player function.

The media player 600 may communicate with mass data storage 610 that stores data such as compressed audio and/or video content in a nonvolatile manner. In some implementations, the compressed audio files include files that are compliant with MP3 (Moving Picture experts group audio layer 3) format or other suitable compressed audio and/or video formats. The mass data storage may include optical and/or magnetic storage devices for example hard disk drives and/or DVD drives. At least one HDD may have the configuration shown in FIG. 5A and/or at least one DVD drive may have the configuration shown in FIG. 5B. The HDD may be a mini HDD that includes one or more platters having a diameter that is smaller than approximately 1.8". The media player 600 may be connected to memory 614 such as RAM, ROM, low latency nonvolatile memory such as flash memory and/or other suitable electronic data storage. The media player 600 also may support connections with a WLAN via a WLAN interface 616. Still other implementations in addition to those described above are contemplated.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A system comprising:
    a control loop configured to generate a clock signal and lock the clock signal to timing marks detected on a machine readable medium;
    a repetitive error correction module configured to receive a predicted phase and a corrected phase error for the clock signal, generate a predicted repetitive phase disturbance using the predicted phase and the corrected phase error for the clock signal, and calibrate a phase error to compensate for variations in repetitive phase errors in the clock signal using the predicted repetitive phase disturbance; and
    a servo track generator configured to generate servo tracks using the clock signal.

2. The system of claim 1, wherein the control loop is further configured to adjust the clock signal, in accordance with an oscillator model, based on the calibrated phase error.

3. The system of claim 2, wherein the oscillator model corresponds to:

$$G_{VCO}(z) = \frac{-ExpectedTMI/C}{1 - z^{-1}};$$

wherein ExpectedTMI is an expected interval between the timing marks, C is a scaling factor, and z is a discrete time variable.

4. The system of claim 3, wherein the oscillator model is configured to transform a control command $U_{PLL}$ for the control loop into the predicted phase $\Phi_P$, wherein the predicted phase corresponds to:

$$\Phi_P(k) = \Phi_P(k-1) - HPF(U_{PLL}) \cdot \frac{ExpectedTMI}{C},$$

wherein HPF represents a function of a high-pass filter.

5. The system of claim 4, wherein $C = 2^{21}$.

6. The system of claim 4, wherein the predicted repetitive phase disturbance $RPD_P$ corresponds to:

$$RPD_P = CPE - (\Phi_P - \overline{\Phi_P});$$

wherein CPE is the corrected phase error, $\Phi_P$ is the predicted phase, and $\overline{\Phi_P}$ is an average predicted phase.

7. An apparatus comprising:
    a voltage controlled oscillator configured to generate a predicted frequency based on a command for a frequency-locked loop; and
    a comparator configured to receive a corrected frequency error and generate a predicted repetitive frequency disturbance using the corrected frequency error, the predicted frequency, and an average predicted frequency over a predetermined number of samples from the frequency-locked loop.

8. The apparatus of claim 7, further comprising a high-pass filter configured to process the command for the frequency-locked loop.

9. The apparatus of claim 7, wherein the predetermined number of samples is over a revolution of a machine readable medium.

10. The apparatus of claim 7, further comprising:
an amplifier configured to scale the predicted repetitive frequency disturbance; and
a delay buffer configured to generate a repetitive frequency error correction using the predicted repetitive frequency disturbance, wherein the repetitive frequency error correction is used to generate an additional corrected frequency error.

11. The apparatus of claim 10, further comprising:
an additional comparator configured to generate a refined repetitive frequency error correction based on the repetitive frequency error correction, wherein the refined repetitive frequency error correction is used to calibrate a frequency error and generate the additional corrected frequency error.

12. The apparatus of claim 11, further comprising a low-pass filter configured to process an average repetitive frequency error correction generated over the predetermined number of samples.

13. The apparatus of claim 10, wherein the delay buffer is a circular buffer.

14. The apparatus of claim 7, wherein the voltage controlled oscillator is configured to operate according to:

$$G_{VCO}(z) = \frac{-ExpectedTMI/C}{1-z^{-1}};$$

wherein ExpectedTMI is an expected interval between timing marks, C is a scaling factor, and z is a discrete time variable.

15. The apparatus of claim 14, wherein $C=2^{21}$.

16. A system comprising:
a frequency-locked loop (FLL) configured to receive an input and determine a frequency error between measured timing information and target timing information;
wherein the FLL is further configured to receive a repetitive frequency error correction determined from the input and a corrected frequency error, the corrected frequency error being a difference between the frequency error and a previous repetitive frequency error correction, and to generate a corrective action; and
circuitry configured to determine the repetitive frequency error correction.

17. The system of claim 16, wherein the circuitry includes a voltage controlled oscillator configured to operate according to:

$$G_{VCO}(z) = \frac{-ExpectedTMI/C}{1-z^{-1}};$$

wherein ExpectedTMI is an expected interval between timing marks, C is a scaling factor, and z is a discrete time variable.

18. The system of claim 16, wherein the FLL is further configured to adjust a clock signal based on the corrective action.

19. The system of claim 18, further comprising a servo track generator configured to generate servo tracks using the clock signal.

20. The system of claim 16, wherein the corrective action specifies an updated repetitive frequency error correction.

* * * * *